United States Patent
Memory et al.

(10) Patent No.: US 6,828,675 B2
(45) Date of Patent: Dec. 7, 2004

(54) MODULAR COOLING SYSTEM AND THERMAL BUS FOR HIGH POWER ELECTRONICS CABINETS

(75) Inventors: Stephen B. Memory, Kenosha, WI (US); Fredrick E. Ganaway, Racine, WI (US); C. James Rogers, Racine, WI (US); Anthony C. DeVuono, Racine, WI (US); Alfred Phillips, Pine Grove, PA (US); Zhijun Zuo, Lancaster, PA (US)

(73) Assignee: Modine Manufacturing Company, Racine, WI (US)

( * ) Notice: Subject to any disclaimer, the term of this patent is extended or adjusted under 35 U.S.C. 154(b) by 533 days.

(21) Appl. No.: 09/963,899

(22) Filed: Sep. 26, 2001

(65) Prior Publication Data

US 2003/0057546 A1 Mar. 27, 2003

(51) Int. Cl.⁷ ................................ H01L 23/34
(52) U.S. Cl. ................ 257/714; 257/715; 361/700; 165/104.33
(58) Field of Search ................ 257/714–715; 361/700; 165/104.33

(56) References Cited

U.S. PATENT DOCUMENTS

| | | |
|---|---|---|
| 4,337,499 A | 6/1982 | Cronin et al. |
| 4,793,405 A | 12/1988 | Diggelmann et al. |
| 5,144,531 A | 9/1992 | Go et al. |
| 5,203,399 A | 4/1993 | Koizumi |
| 5,343,358 A | 8/1994 | Hilbrink |
| 5,675,473 A * | 10/1997 | McDunn et al. ............ 361/699 |
| 5,727,618 A | 3/1998 | Mundinger et al. |
| 5,946,191 A | 8/1999 | Oyamada |
| 6,052,285 A | 4/2000 | Hileman |
| 6,125,036 A | 9/2000 | Kang et al. |
| 6,131,647 A | 10/2000 | Suzuki et al. |
| 6,137,682 A | 10/2000 | Ishimine et al. |
| 6,223,810 B1 | 5/2001 | Chu et al. |
| 6,229,704 B1 | 5/2001 | Hoss et al. |

\* cited by examiner

*Primary Examiner*—Luan Thai
(74) *Attorney, Agent, or Firm*—Wood, Phillips, Katz, Clark & Mortimer

(57) ABSTRACT

A modular cooling system (10) is provided for use in an electronics enclosure (12) mounting a plurality of heat generating electronic components (14). The cooling system (10) includes a cooling liquid supply manifold (16), a cooling liquid return manifold (18), and a plurality of cooling modules (20) that are selectively mountable into the electronic enclosure (12). The cooling system (10) also includes a wall (64) fixed in the enclosure to separate the electronic components (14) from the manifolds (16,18) to shield the electronic components (14) from any of the cooling liquid (52) should it leak from the system (10).

45 Claims, 5 Drawing Sheets

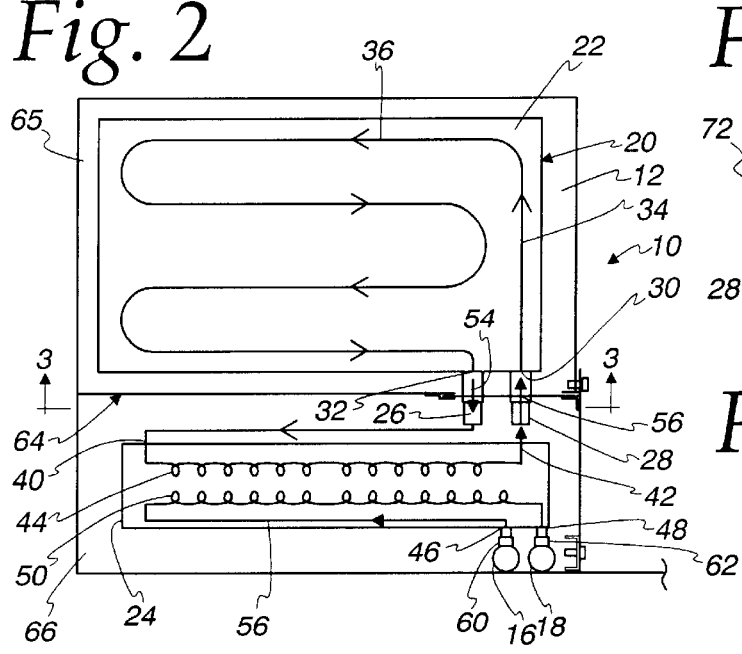
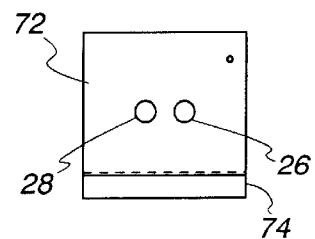
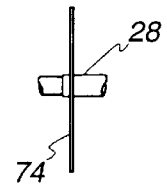
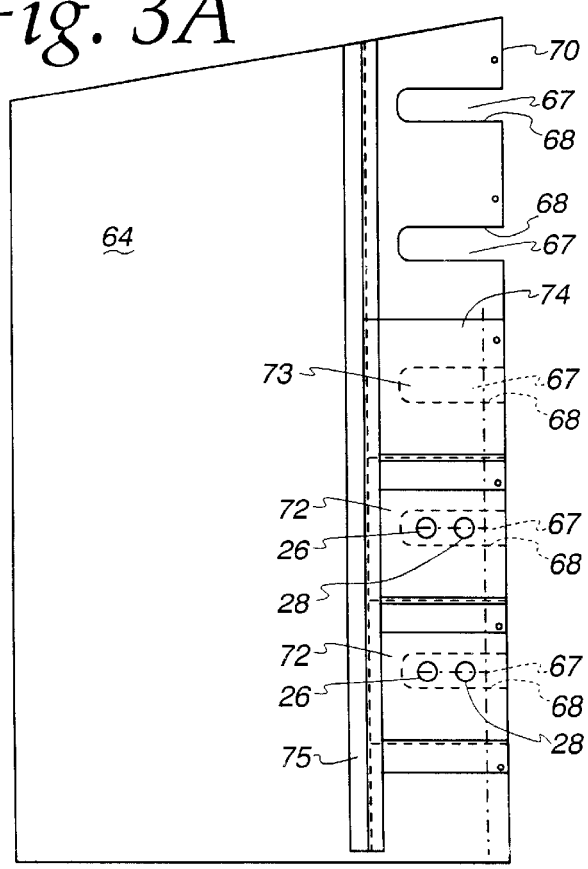
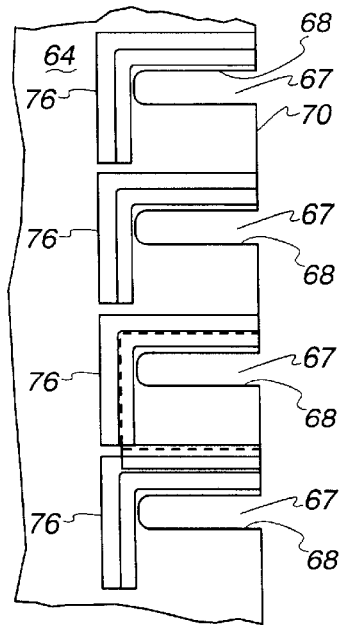

MODULAR COOLING SYSTEM AND THERMAL BUS FOR HIGH POWER ELECTRONICS CABINETS

FIELD OF THE INVENTION

This invention relates to the cooling of electronics and more particularly to the cooling of electronics enclosures containing high power density electronic components.

BACKGROUND OF THE INVENTION

It is well known to mount electronic components in an electronics enclosure, such as an electronic cabinet. Often the electronic components include a number of high power density components, such as amplifiers, RF modules, etc. which generate an appreciable amount of heat that must be dissipated to ensure optimum operation of the electronic components within the enclosure. It is known to dissipate the heat of such enclosures using forced air cooling and/or by mounting the electronic components on cold plates that allow the heat of the electronic components to be rejected to a cooling medium. Due to ever increasing power densities on both the component and board levels in a number of applications, such as telecommunications and enterprise server applications, air cooling within electronics enclosures is reaching its limit. Accordingly, the cooling of high power enclosures using cold plates is increasing.

In a typical cold plate system, the electronic components are placed on a cold plate through which a working fluid, such as a refrigerant or other coolant, is passed. Heat is rejected from the electronic components into the working fluid passing through the cold plate. Typically, the emerging working fluid is then run through an air-cooled heat exchanger where the heat is rejected from the working fluid to an air-stream that takes the heat away from the system. While such systems may work well for their intended purpose, there is always room for improvement.

SUMMARY OF THE INVENTION

The primary object of the invention is to provide an improved cooling system for electronics enclosures, such as high power electronics cabinets.

It is another object of the invention to provide a cooling system for an electronics enclosure that allows the user of the electronics enclosure to expand the thermal cooling solution as electronic components are added to the electronics enclosure.

According to one form of the invention, a modular cooling system is provided for an electronics enclosure that mounts a plurality of heat generating electronic components. The cooling system includes a plurality of cooling modules selectively mountable into the electronics enclosure, a cooling liquid supply manifold, and a cooling liquid return manifold. Each of the cooling modules includes an evaporative cold plate, a condenser, a vapor conduit, and a liquid conduit. The evaporative cold plate includes an evaporative flow path to direct a working fluid through the cold plate in heat exchange relation with electronic components associated with the cold plate to reject heat from the electronic components to the working fluid. The condenser includes a condensing flow path to direct the working fluid through the condenser in heat exchange relation with a cooling liquid to reject heat from the working fluid to the cooling liquid, a cooling liquid inlet connection, a cooling liquid outlet connection, and a cooling liquid flow path to direct the cooling liquid through the condenser from the cooling liquid inlet to the cooling liquid outlet in heat exchange relation with working fluid in the condensing flow path to reject heat from the working fluid to the cooling liquid. The vapor conduit connects the cold plate to the condenser to direct vapor phase working fluid from the evaporative flow path to the condensing flow path. The liquid conduit connects the condenser to the cold plate to direct liquid phase working fluid from the condensing flow path to the evaporative flow path. The cooling liquid supply manifold includes a plurality of cooling liquid supply connections, with each supply connection configured to connect with the cooling liquid inlet connection of one of the cooling modules to supply cooling liquid thereto. The cooling liquid return manifold includes a plurality of cooling liquid return connections, with each of the return connections configured to connect with the cooling liquid outlet connection of one of the cooling modules to receive cooling liquid therefrom.

In one aspect of the invention, the cooling system further includes a wall in the enclosure separating the electronic components and evaporative cold plates from the cooling liquid supply and return manifolds and the condensers of each of the cooling modules to shield the electronic components from the cooling liquid should the cooling liquid leak from the system. The wall includes a plurality of openings through which the vapor and liquid conduits may pass.

In a further aspect, each of the openings is a notch formed in a side of the wall that allows the vapor and liquid conduits of one of the cooling modules to be inserted into the electronics enclosure without disconnecting the vapor and liquid conduits from the condenser and evaporative cold plate of the cooling module.

In one aspect of the invention, a modular cooling system is provided for an electronics enclosure that mounts a plurality of heat generating electronic components. The cooling system includes a plurality of cooling modules selectively mountable into the electronics enclosure, a cooling fluid supply manifold, a cooling fluid return manifold, and a wall. Each of the cooling modules includes an evaporative cold plate, a condenser, a vapor conduit, and a liquid conduit. The evaporative cold plate includes an evaporative flow path to direct a working fluid through the cold plate in heat exchange relation with electronic components associated with the cold plate to reject heat from the electronic components to the working fluid. The condenser includes a condensing flow path to direct the working fluid through the condenser in heat exchange relation with a cooling fluid to reject heat from the working fluid to the cooling fluid. The vapor conduit connects the evaporative cold plate to the condenser to direct vapor phase working fluid from the evaporative flow path to the condensing flow path. The liquid conduit connects the condenser to the evaporative cold plate to direct liquid phase working fluid from the condensing flow path to the evaporative flow path. The cooling fluid supply manifold directs the cooling fluid to each of the condensers. The cooling fluid return manifold directs the cooling fluid from each of the condensers. The wall is positioned in the electronics enclosure to separate the electronic components and evaporative cold plates from the cooling fluid supply and return manifolds and the condensers of each of said cooling modules to shield the electronic components from the cooling fluid should the cooling fluid leak from the system. The wall includes a plurality of notches through which the vapor and liquid conduits may pass, with each of the notches being formed in a side of the wall to allow the vapor and fluid conduits of one of the cooling modules to be inserted into the electronics enclosure without disconnecting the vapor and liquid conduits from the condenser and evaporative cold plate of the cooling module.

In one aspect of the invention, a modular cooling system is provided for an electronics enclosure that mounts a plurality of heat generating electronic components. The cooling system includes a plurality of cooling modules selectively mountable into the electronics enclosure, a cooling liquid supply manifold, a cooling liquid return manifold, and a wall. Each of the cooling modules includes an evaporative cold plate, a condenser, a vapor conduit, and a liquid conduit. The evaporative cold plate includes an evaporative flow path to direct a working fluid through the cold plate in heat exchange relation with electronic components associated with the cold plate to reject heat from the electronic components to the working fluid. The condenser includes a condensing flow path to direct the working fluid through the condenser in heat exchange relation with a cooling liquid to reject heat from the working fluid to the cooling liquid. The vapor conduit connects the evaporative cold plate to the condenser to direct vapor phase working fluid from the evaporative flow path to the condensing flow path. The liquid conduit connects the condenser to the evaporative cold plate to direct liquid phase working fluid from the condensing flow path to the evaporative flow path. The cooling liquid supply manifold directs the cooling liquid to each of the condensers. The cooling liquid return manifold directs the cooling liquid from each of the condensers. The wall is positioned in the electronics enclosure to separate the electronic components and evaporative cold plates from the cooling liquid supply and return manifolds and the condensers of each of said cooling modules to shield the electronic components from the cooling liquid should the cooling liquid leak from the system.

In another aspect of the invention, each of the cooling modules further includes a baffle plate mounted on the cooling module to close one of the openings in the wall through which the vapor and liquid conduits of the cooling module pass. In a further aspect, each of the baffle plates is mounted on the vapor and liquid conduits of the associated cooling module.

In accordance with another aspect of the invention, a cooling module is provided for use in a modular cooling system for an electronics enclosure mounting a plurality of heat generating electronic components. The cooling system includes a cooling liquid supply manifold and cooling liquid return manifold. The cooling module includes an evaporative cold plate, a condenser, a vapor conduit, and a liquid conduit. The cold plate includes a cold plate inlet, a cold plate outlet, and an evaporative flow path to direct a working fluid from the cold plate inlet to the cold plate outlet in heat exchange relation with electronic components associated with the cold plate to reject heat from the electronic components to the working fluid. The condenser includes a working fluid inlet, a working fluid outlet, a condensing flow path to direct the working fluid through the condenser from the working fluid inlet to the working fluid outlet, a cooling liquid inlet connection configured to releasably connect to the cooling liquid supply manifold to receive cooling liquid therefrom, a cooling liquid outlet connection configured to releasably connect to the cooling liquid return manifold to deliver cooling liquid thereto, and a cooling liquid flow path to direct a cooling liquid through the condenser from the cooling liquid inlet to the cooling liquid outlet in heat exchange relation with the working fluid in the condensing flow path to reject heat from the working fluid to the cooling liquid. The vapor conduit connects the cold plate outlet to the working fluid inlet to direct vapor phase working fluid from the evaporative cold plate to the condenser. The liquid conduit connects the working fluid outlet to the cold plate inlet to direct liquid phase working fluid from the condenser to the evaporative cold plate. In one aspect, the connections comprise quick disconnects.

As one feature, the evaporative flow path, the vapor conduit, the condensing flow path, and the liquid conduit form a thermosiphon for the working fluid flow through the cooling module.

As another feature, the evaporative flow path, the vapor conduit, the condensing flow path, and the liquid conduit form a heat pipe for the working fluid flow through the cooling module.

As yet another feature, the evaporative flow path, the vapor conduit, the condensing flow path, and the liquid conduit form a looped heat pipe for the working fluid flow through the cooling module.

As one feature, the cooling module further includes a pump associated with the liquid conduit to enhance the working fluid flow through the cooling module, with the evaporative flow path, the vapor conduit, the condensing flow path, the pump, and the liquid conduit forming a pumped two-phase cooling cycle for the working fluid flow through the cooling module.

Other objects and advantages will become apparent from the following specification and claims taken in connection with the accompanied drawings.

DESCRIPTION OF THE DRAWINGS

FIG. 2 is a somewhat diagrammatic section view taken along line 2—2 in FIG. 1;

FIG. 3A and 3B are somewhat diagrammatic views taken along line 3—3 of FIG. 2 showing two alternate embodiments of an electronics cabinet for use in the invention;

FIGS. 4A and 4B are front and side views, respectively, of a baffle plate for use in the invention;

DESCRIPTION OF THE PREFERRED EMBODIMENTS

Figure 1:
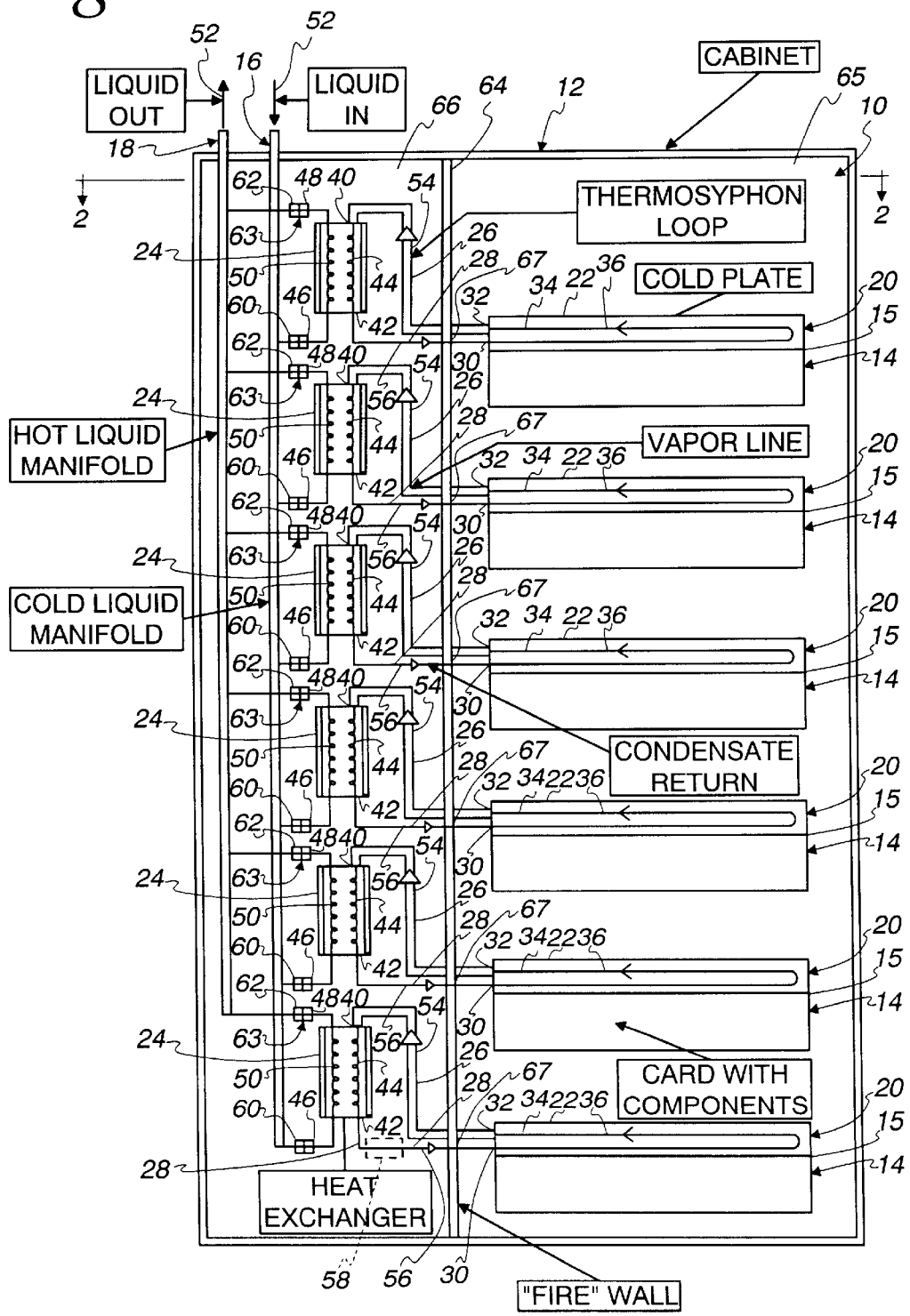
FIG. 1 is a diagrammatic representation of a cooling system embodying the present invention.

With reference to FIGS. 1 and 2, a modular cooling system 10 embodying the present invention is shown in an electronics enclosure 12 mounting a plurality of heat generating electronic components 14, which are typically mounted in groups on so-called "cards" 15. The cooling system 10 includes a cooling liquid supply manifold 16, a cooling liquid return manifold 18, and a plurality of cooling modules 20 that are selectively mountable into the electronics enclosure 12.

Each of the cooling modules 20 includes an evaporative cold plate 22, a condenser 24, a vapor conduit 26, and a liquid conduit 28. While the cards 15 can be support by other structure in the enclosure 12, it is preferred that the cards 15 be mounted on and carried by the cold plates 22. Further, while the cards 15 can be bolted onto each of the cold plates 22, it is preferred that the cards 15 be bonded to the cold plates 22 to improve thermal conduction from the cards 15 to the cold plates 22. It should be appreciated that the modular design of the cooling system 10 allows for such bonding because each of the modules 20, including its cold plate 22, can be selectively removed from the enclosure 12 so that a card can be bonded to the cold plate 22. In one preferred form, the cards 15 are metallurgically bonded to the cold plates 22 such as by brazing or soldering.

The evaporative cold plate 22 includes a cold plate inlet 30, a cold plate outlet 32, and an evaporative flow path 34 to direct a working fluid 36 from the cold plate inlet 30 to the cold plate outlet 32 in heat exchange relation with the electronic components 14 associated with the cold plate 22 to reject heat from the electronic components 14 to the working fluid 36. The condenser 24 includes a working fluid inlet 40, a working fluid outlet 42, a condensing flow path 44 to direct the working fluid 36 through the condenser from the working fluid inlet 40 to the working fluid outlet 42, a cooling liquid inlet connection 46, a cooling liquid outlet connection 48, and a cooling liquid flow path 50 to direct a cooling liquid 52, such as water, through the condenser 24 from the cooling liquid inlet connection 46 to the cooling liquid outlet connection 48 in heat exchange relation with the working fluid 36 in the condensing flow path 44 to reject heat from the working fluid 36 to the cooling liquid 52. The vapor conduit 26 connects the cold plate outlet 32 to the working fluid inlet 40 to direct vapor phase working fluid 54 from the evaporative cold plate 22 to the condenser 24. The liquid conduit 28 connects the working fluid outlet 42 to the cold plate inlet 30 to direct liquid phase working fluid 56 from the condenser 24 to the evaporative cold plate 22.

In one preferred embodiment of the module 20, the evaporative flow path 34, the vapor conduit 26, the condensing flow path 44, and the liquid conduit 28 form a looped thermosiphon for flow of the working fluid 36 through the cooling module 20, with the condensing flow path 44 arranged above the evaporative flow path 34 for gravity feed of the liquid phase working fluid 56 through the liquid conduit 28. As a thermosiphon, differences in the vapor pressure and densities of the working fluid 36 in the evaporative flow path 34 and the condensing flow path 44 serve as the primary factors in moving the working fluid 36 through the module 20.

In another embodiment of the module 20, the evaporative flow path 34, the vapor conduit 26, the condensing flow path 44, and the liquid conduit 28 are provided in the form of one or more tubular thermosiphons, with the evaporative flow path 34 located at one end of the tubular thermosiphon(s), the condensing flow path 44 located at the other end of the tubular thermosiphon(s), the vapor conduit 26 being defined by the open space within the tubular shell of the thermosiphon(s), and the liquid conduit 28 being defined by or contained within the open space of the tubular shell of the thermosiphon(s).

In another preferred embodiment of the module 20, the evaporative flow path 34, the vapor conduit 26, the condensing flow path 44, and the liquid conduit 28 form a looped heat pipe for flow of the working fluid 36 through the cooling module 20, with the liquid conduit 28 being or including a capillary member, such a capillary tube or a wick, to draw the liquid phase working fluid 56 from the condensing flow path 44 to the evaporative flow path 34. As a heat pipe, differences in the vapor pressures of the working fluid 36 in the evaporative flow path 34 and the condensing flow path 44, and capillary action in the liquid conduit 28 serve as the primary factors in moving the working fluid 36 through the module 20.

In yet another embodiment of the module 20, the evaporative flow path 34, the vapor conduit 26, the condensing flow path 44, and the liquid conduit 28 are provided in the form of one or more tubular heat pipes, with the evaporative flow path 34 located at one end of the tubular heat pipe(s), the condensing flow path 44 located at the other end of the tubular heat pipe(s), the liquid conduit 28 being a capillary member(s) of the heat pipe(s) extending between the ends, and the vapor conduit 25 being defined by the open space within the tubular shell of the heat pipe(s).

In another embodiment of the module 20, the module 20 includes a pump 58 (shown schematically at the bottom module 20 of FIG. 1) that pumps the liquid phase working fluid 56 to enhance the flow of the working fluid 36 through the module 20 so that the evaporative flow path 34, the vapor conduit 26, the condensing flow path 44, and the liquid conduit 28 form a pumped two-phase cooling cycle for flow of the working fluid 36 through the cooling module 20. As a pumped two-phase cooling cycle, differences in the vapor pressure in the evaporative flow path 34 and the condensing flow path 44, and the pump 58 serve as the primary factors in moving the working fluid 36 through the module 20.

Preferably, when the module 20 is provided in the form of a thermosiphon, a looped heat pipe, or a pumped two-phase cooling cycle, the vapor conduit 26 is permanently connected to the cold plate outlet 32 and to the working fluid inlet 40, and the liquid conduit 28 is permanently connected to the working fluid outlet 42 and the cold plate inlet 30, using suitable permanent fittings or connections, such as for example brazed fittings. However, while permanent connections are preferred, it may be advantageous to some applications for releasable connections to be employed for one or more of the connections between the vapor conduit 26 and the cold plate outlet 32 and working fluid inlet 40, and the liquid conduit 28 and the working fluid outlet 42 and cold plate inlet 30.

The cooling liquid supply manifold 16 includes a plurality of cooling liquid supply connections 60. Preferably, each of the supply connections 60 is a suitable releasable fitting configured to releasably connect with the cooling liquid inlet connection 46 of one of the cooling modules 20 to supply the cooling liquid 52 thereto.

The cooling liquid return line 18 includes a plurality of cooling liquid return connections 62. Preferably, each of the return connections 62 is a suitable releasable fitting configured to releasably connect with the cooling liquid outlet connection 48 of one of the cooling modules 20 to receive the cooling liquid 52 therefrom.

Preferably, each of the connections 46, 48, 60 and 62 are provided in the form of suitable quick disconnects 63.

The system 10 further includes a wall 64 fixed in the enclosure and separating the electronic components 14 and the evaporative cold plates 22 from the cooling liquid supply and return manifolds 16, 18 and the condensers 24 to shield the electronic components 14 from any of the cooling liquid 52 should it leak from the system 10, particularly from the connections 46, 48, 60 and 62. It can be seen in FIGS. 1 and 2 that the wall 64 separates the interior of the electronics enclosure 12 into an electronics compartment 65 that contains the electronic components 14 and the evaporative cold plate 22, and a thermal bus compartment 66 that contains the condensers 24 and manifolds 16, 18. The wall 64 includes a plurality of openings 67 through which the vapor and liquid conduits 26 and 28 may pass for the modules 20 that are installed in the enclosure 12. As best seen in FIGS. 3A and 3B, it is preferred that the openings 67 be provided in the form of notches 68 that are formed in a side 70 of the wall 64. Each of the notches 68 allows the vapor and liquid conduit 26, 28 of one of the cooling modules 20 to be inserted into the electronics enclosure 12 without disconnecting the vapor and liquid conduits 26, 28 from the condenser 24 and evaporative cold plate 22 of the cooling modules 20. This allows for the vapor conduit 26 to be permanently connected to the cold plate outlet 32 and the working fluid inlet 40, and the liquid conduit 28 to be permanently connected to the working fluid outlet 42 and the cold plate inlet 30.

In some applications, it may be advantageous for the wall 64 to also serve as a so-called "fire wall" for the enclosure 12.

As best seen in FIGS. 3A, 3B, 4A and 4B, it is also preferred that a baffle plate 72 be provided for closing each of the openings 67 through which the vapor and liquid conduits 26 and 28 pass. As best seen in FIG. 4, it is preferred that each of the baffle plates 72 be mounted on the cooling module, preferably carried by the vapor and liquid conduits 26 and 28. While not necessarily required in all applications, it is also preferred that each of the baffle plates 72 have a substantially liquid tight seal performed around each of the conduits 26 and 28, with the seal being provided by any suitable means, such as for example, gaskets, caulk, or a brazed connection between the plate 72 and the conduit 26 and 28. As best seen in FIG. 3A, it is also preferred that blank baffle plates 73 be provided to close any of the openings 67 through which the vapor and liquid conduits 26 and 28 do not pass. As best seen in FIGS. 4A and 4B, it is preferred that each of the plates 72, 73 have a lip 74 that will extend over the upper edge of a plate 72, 73 positioned below the lip to shield the upper edge from leakage of the cooling liquid 52, thereby providing a "shingled" arrangement of the plates 72, 73. Preferably, the plates 72, 73 are received in a vertical extending bracket 75 having a lip extending from the wall 64 to receive the plates 72, 73, with the plates 72, 73 being sealed by gaskets or caulk to the wall 64 when they are installed to close the openings 67. Alternatively, as best seen in FIG. 3B, L-shaped flanges 76 are to be arranged so that the plates 72 and 74 can be nested under the flanges 76, with the flanges 76 opening downwardly so that any cooling liquid 52 on the condenser side 66 of the enclosure 12 would drain down over the flanges 76 which act like shingles to prevent leakage into the component side 65 of the enclosure 12.

In operation, the working fluid 36 in each module 20 is evaporated in the evaporative cold plate 22 by the heat rejected from the electronic components 14 associated with the cooling module 20. The vapor phase working fluid 54 then flows from the cold plate outlet 32 to the working fluid inlet 40 via the vapor conduit 26. The vapor phase working fluid 54 is then condensed as it flows through the condensing flow path 44 by rejecting its heat to the cooling liquid 52 that flows through the cooling liquid flow path 50 of the condenser 24. The liquid phase working fluid 56 then flows from the working fluid outlet 42 to the cold plate inlet 40 via the liquid conduit 28 so that it can be evaporated in the evaporative cold plate 22, thus completing the cooling cycle. The cooling liquid 52 is supplied to each of the condensers 24 by the cooling liquid supply manifold 16, and the heated cooling liquid 52 is received from the condensers 24 by the cooling liquid return manifold 18 which then directs the cooling liquid 52 out of the enclosure 12 where it can be cooled remotely. For example the cooling liquid supply and return manifolds 16 and 18 can be connected into an existing or dedicated building water loop, with the final projection of heat to ambient being achieved by any suitable means, such as cooling towers or a central mechanical room for conditioning using a refrigerant system. Preferably, the cooling liquid 52 remains single phase as it passes through the supply manifold 16, the condensers 24 and the return manifold 18 to alleviate balancing issues as new cooling modules 20 are added to the enclosure 12. The flow and pressure of the cooling liquid 52 supplied to the cooling liquid supply manifold 16 should be sufficient to provide adequate flow and cooling to the system 10 when all of the cooling modules 20 of the system are installed, i.e. when the enclosure 12 is fully stocked.

Preferably, the pressure of the working fluid 36 in each of the modules 20 is such that the working fluid 36 operates above the dew point temperature of the working environment of the enclosure 12 to ensure that no condensate forms on the outside of any of the components of the system 10 and/or on the electronic components 14 contained within the enclosure 12. It is also preferred that the cooling liquid 52 also be maintained at a temperature that is above the dew point at all time as it passes through the supply manifold 16, the condensers 24, and the return manifold 18.

While the condensers 24 may be of any suitable construction, it is preferred that each of the condensers 24 be of a cross-counter flow construction. However, the details of the condensers 24, as well as of the cold plates 22, will be highly dependent upon the parameters, such as heat load, types of electronic components, available envelope, environment, life cycle, etc., of each particular application.

Figure 5:
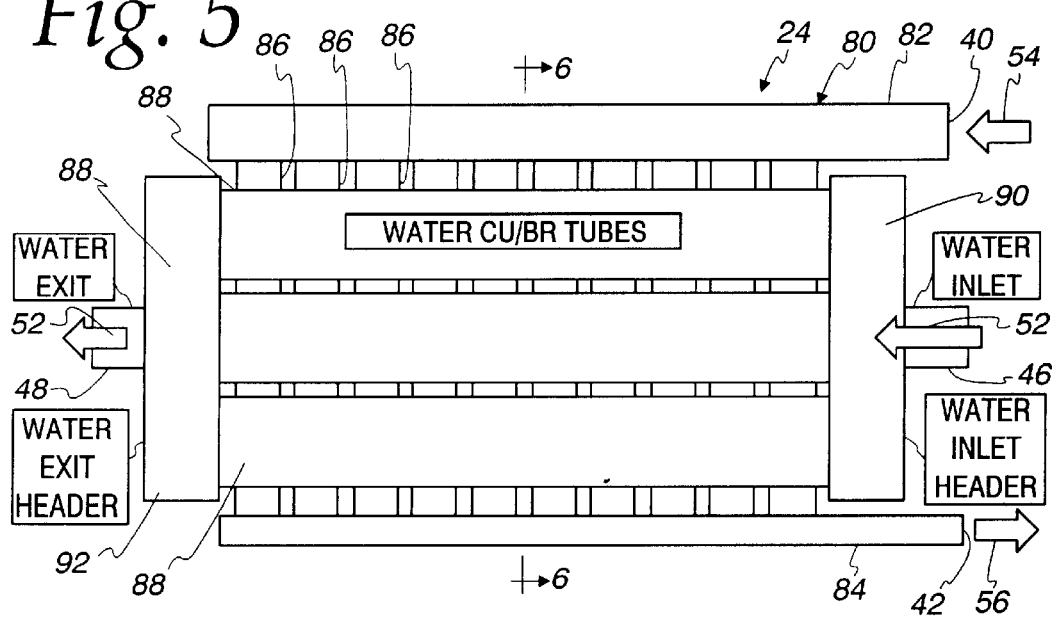
FIG. 5 is a diagrammatic representation of a heat exchanger employed in the system of FIG. 1.
Figure 6:
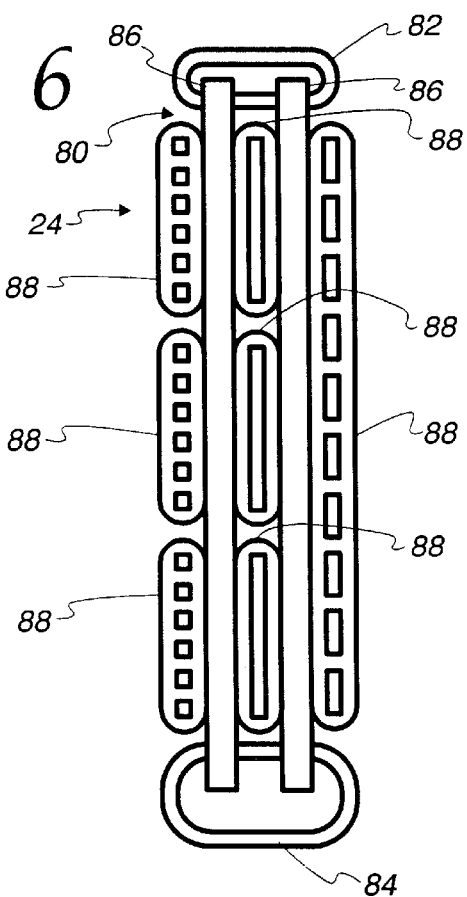
FIG. 6 is a view taken along line 6—6 of FIG. 5.

By way of example, FIGS. 5 and 6 show one embodiment 80 for each of the condensers 24. On the working fluid side, the condenser 80 includes a vapor inlet manifold 82 that receives the vapor phase working fluid 54 from the working fluid inlet 40, a condensate manifold 84 that directs the liquid phase working fluid 56 to the working fluid outlet 42, and a series of flattened tubes 86 which extend parallel to each other from the vapor manifold 82 downwardly to the condensate manifold 84. The tubes 86 are sandwiched between other flattened tubes 88 that run generally horizontally from a cooling liquid inlet manifold 90 to a cooling liquid outlet manifold 92. It should be understood that for purposes of illustration FIG. 6 shows three possible cross-sections for the tubes 88, but that it is preferred that a single cross-section be chosen and used consistently for each of the tubes 88 of the condenser 80 for each particular application. It should also be appreciated that while the condenser 80 shown in FIGS. 5 and 6 shows two passes on the working fluid side and three passes on the cooling liquid side, the actual number of passes on each side could be more or less depending upon the required capacity and given tube geometry for the condenser 80. In one form, the tubes 86 are roll-formed copper tubes and the tubes 88 are copper-brass tubes that could be micro-extrusions, macro-extrusions, or roll formed tubes depending upon the particular cross-sections selected. In another form, the condenser 80 is an all-aluminum brazed construction, with micro-extrusions on the working fluid side and macro-extrusions on the cooling liquid side.

As another example, the condenser 24 can be constructed using a stacked plate type construction having alternating pairs of formed plates, with one set of the plate pairs defining parallel flow channels for the working fluid flow path 50 and the other set of plate pairs defining parallel flow channels for the condensing flow path 44.

It should be understood that the location of the connections 46, 48, 60 and 62 shown in FIGS. 1 and 2 are for purposes of illustration, and that the exact location of these connections relative to their associated condenser 24 and manifolds 16 and 18 will be highly dependent upon the requirements of the particular application. The same can be said for the location of the manifolds in 16 and 18 in the enclosure 12. Further, it should be understood that for purposes of installing each of the modules 20, it may be desirable to provide a certain amount of flexibility in at least one of the conduits 26, 28 and the connections 46, 48, 60 and 62 to allow for inaccuracies in the assembly of the system 10 and the enclosure 12. It should also be understood that any of the connections 46, 48, 60 and 62 may also include a suitable conduit that connects to an associated condenser 24 or manifold 16, 18.

It should further be understood that while FIGS. 1 and 2 show the evaporative cold plates 22 lying in essentially horizontal planes, it may be advantageous in some applications for the cold plates 22 to extend vertically rather than horizontally, or to extend in an orientation that is between vertical and horizontal. In this regard, regardless of the orientation of the cold plate 22, it will typically be advantageous for there to be a suitable amount of rise in the working fluid path 34 as it extends from the inlet 30 to the outlet 32. One advantage of the orientation shown in FIG. 1 is that the heat from the electronic components 14 rises into the evaporative cold plate 22 and is introduced into the evaporative cold plate 22 adjacent to the portion of the flow path 34 that extends from the working fluid inlet 30, thereby enhancing the efficiency of the transfer of heat to the working fluid 36.

While it is preferred that the manifolds 16, 18 provide a cooling liquid to the condensers 24, it may be advantageous for the manifolds 16 and 18 to provide a cooling fluid that at least partially transforms into its vapor phase as it passes through the condensers 24, or a cooling fluid, such as conditioned air, that is always a vapor or gas as it passes through the manifolds 16, 18 and the condensers 24.

Figure 7:
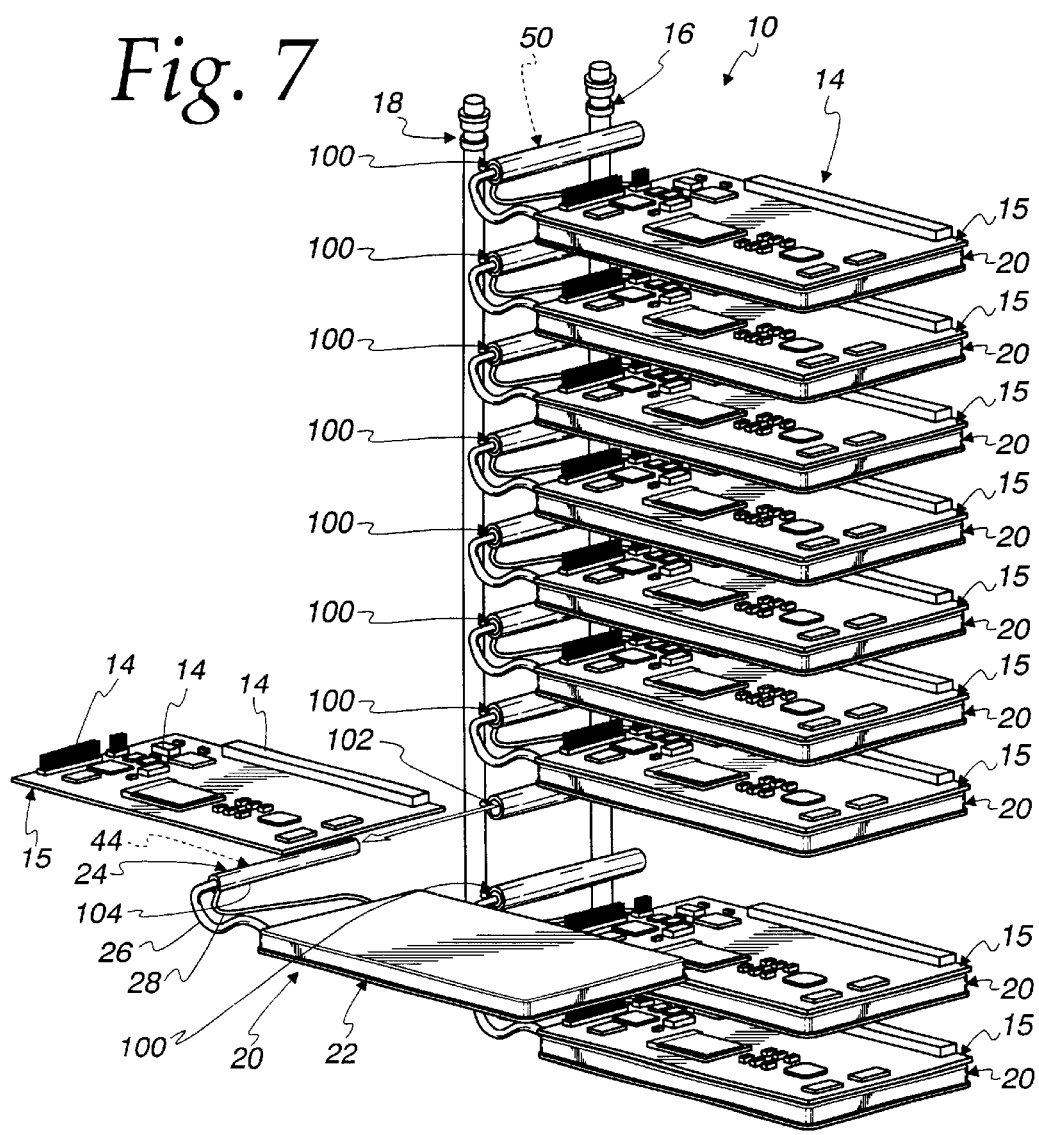
FIG. 7 is a perspective, partially exploded view of another embodiment of the cooling system of the invention.
Figure 8:
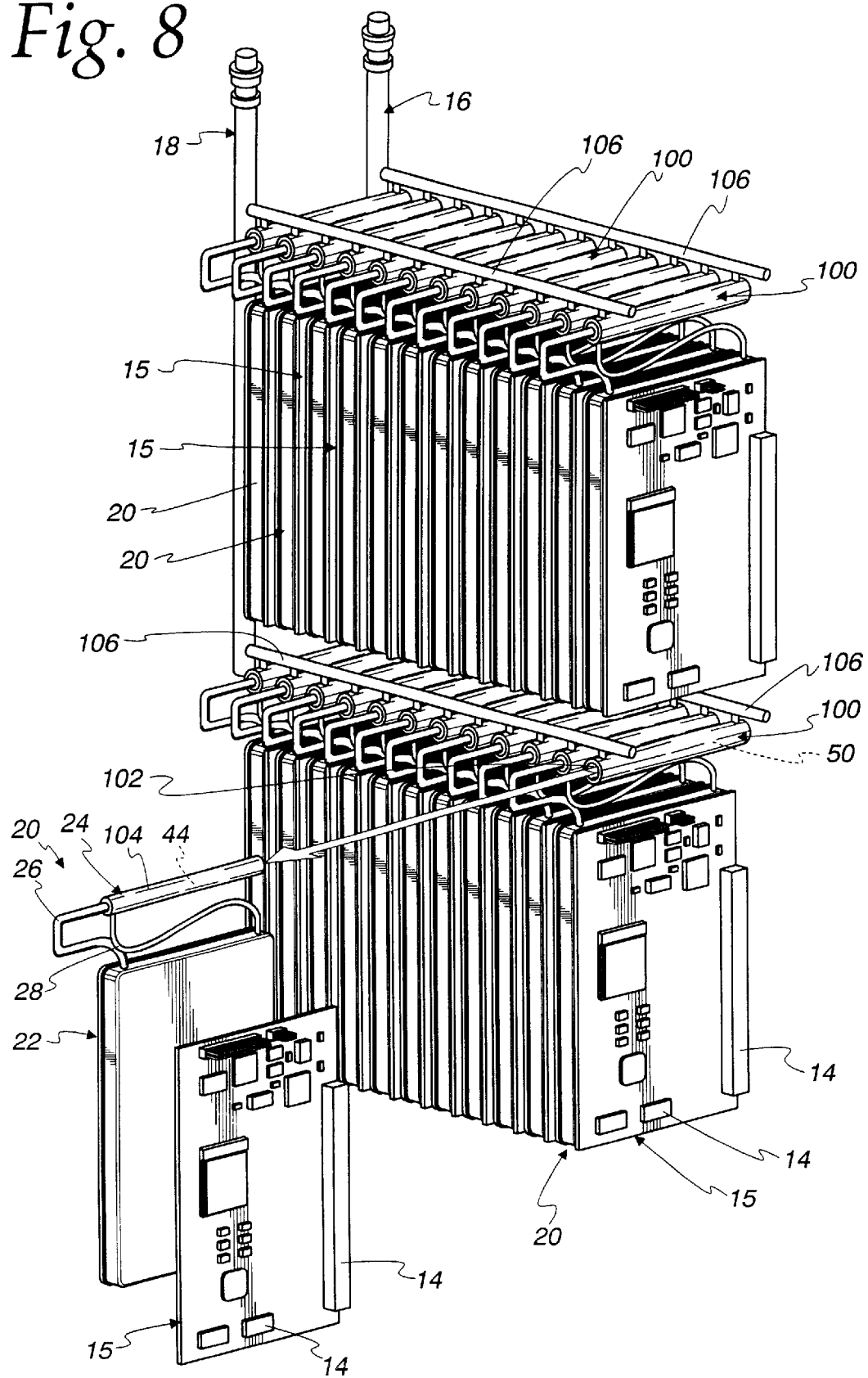
FIG. 8 is a perspective, partially exploded view of yet another embodiment of the cooling system of the invention.

FIGS. 7 and 8 show two alternate embodiments for the cooling system 10. These embodiments differ from those shown in FIGS. 1, 2, 5 and 6 in that the cooling liquid flow paths 50 are defined in a plurality of heat exchangers 100 rather than in the condensers 24 of the cooling modules 20. More specifically, each of the heat exchangers 100 extends between the cooling liquid supply manifold 16 and the cooling liquid return manifold 18 and includes a cooling liquid flow path 50 for directing the cooling liquid in heat exchange relation with the working fluid 36 flowing in the condensing flow path 44 of one of the condensers 24 which is engaged with the heat exchanger 100. While the thermal efficiency of this construction may be somewhat inferior to that offered by the constructions shown in FIGS. 1,2, 5 and 6, the use of the heat exchangers 100 allows for the connections 46, 48, 60 and 62 to be eliminated, thereby reducing the possibility that the cooling liquid 52 will leak from the system 10. In the illustrated embodiments, each of the heat exchangers 100 has a cylindrical inner surface 102 that is adapted to slidably receive a cylindrical outer surface 104 of a corresponding one of the condensers 24. However, it should be understood that in some applications it may be advantageous for the surfaces 102 and 104 to have non-cylindrical conforming shapes, such as planar. It may also be advantageous in some applications to utilize thermal grease between the surfaces 102 and 104 to improve thermal conductivity. FIG. 7 shows the system 10 with a horizontal orientation for the cold plates 22, while FIG. 8 shows the system 10 with a vertical orientation for the cold plates 22 with the heat exchangers 100 being supplied by horizontally extending members 106 of the manifolds 16 and 18. It should be noted the vapor and liquid conduits 26, 28 are routed in these embodiments to be compatible with the wall 64, notches 68 and baffle plates 72 shown in FIGS. 3A, 3B, 4A, and 4B. Except for the different arrangement of the cooling liquid flow path 50 described above, the cooling modules 20 in these embodiments offer the same options and operate the same as the cooling modules 20 of FIGS. 1, 2, 5, and 6.

It should be appreciated that by providing for a modular construction, the system 10 can be delivered to a user with less than a full compliment of the cooling modules 20, thereby allowing a user to forego the cost of purchasing a full compliment of cooling modules 20 until the users application requires that the enclosure 12 be fully stocked with electronic components 14. In other words, as a user needs to add more electronic components 14, additional cooling modules 20 can be purchased so that the thermal solution for the electronics enclosure 12 is increased as a user's needs require.

It should also be appreciated that the modular construction allows the bond between the evaporative cold plate 22 and it associated electronic components 14, such as a card 15 carrying components 14, to be metallurgical, or at least more permanent than conventional applications where the electronics card is slipped in and bolted onto a cold plate using thermal grease. This has advantages in reducing the thermal resistance associated with a non-brazed/soldered bond.

Further, it should be appreciated that by providing the wall 64, the cooling liquid 52 is kept away from the electronic components 14, with any small leak, such as a slow drip, simply falling to the floor of the enclosure 12, and any larger leak, such as a spray, being contained by the wall 64. While it is preferred that the system 10 include the wall 64, it may be advantageous in some applications for the system 10 to be provided without the wall 64.

Preferably, each of the modules 20 is of identical construction thereby allowing for a reduction in the number of different parts required for manufacturing. However, it may be advantageous in some applications for one or more of the modules 20 to have a construction that differs from other modules 20.

We claim:

1. A modular cooling system for an electronics enclosure mounting a plurality of heat generating electronic components; the cooling system comprising:

a plurality of cooling modules selectively mountable into the electronics enclosure, each of the cooling modules comprising an evaporative cold plate including an evaporative flow path to direct a working fluid through the cold plate in heat exchange relation with electronic components associated with the cold plate to reject heat from the electronic components to the working fluid, a condenser including a condensing flow path to direct the working fluid through the condenser in heat exchange relation with a cooling liquid to reject heat from the working fluid to the cooling liquid, a cooling liquid inlet connection, a cooling liquid outlet connection, and a cooling liquid flow path to direct the cooling liquid through the condenser from the cooling liquid inlet to the cooling liquid outlet in heat exchange relation with the working fluid in the condensing flow path to reject heat from the working fluid to the cooling liquid, a vapor conduit connecting the evaporative cold plate to the condenser to direct vapor phase working fluid from the evaporative flow path to the condensing flow path, and a liquid conduit connecting the condenser to the evaporative cold plate to direct liquid phase working fluid from the condensing flow path to the evaporative flow path;

a cooling liquid supply manifold including a plurality of cooling liquid supply connections, each of the supply connections configured to connect with the cooling liquid inlet connection of one of said cooling modules to supply cooling liquid thereto; and a cooling liquid return manifold including a plurality of cooling liquid return connections, each of the return connections configured to connect with the cooling liquid outlet connection of one of said cooling modules to receive cooling liquid therefrom.

2. The modular cooling system of claim 1 further comprising a wall positioned in the enclosure to separate the electronics components and evaporative cold plates from the cooling liquid supply and return manifolds and the condensers of each of said cooling modules to shield the electronic components from the cooling liquid should the cooling liquid leak from the system, the wall including a plurality of openings through which the vapor and liquid conduits may pass.

3. The modular cooling system of claim 2 wherein each of said openings is a notch formed in a side of said wall that allows the vapor and liquid conduits of one of said cooling modules to be inserted into the electronics enclosure without disconnecting the vapor and liquid conduits from the condenser and evaporative cold plate of said one of said cooling modules.

4. The modular cooling system of claim 3 wherein each of said cooling modules further comprises a baffle plate mounted on the cooling module to close one of said openings through which the vapor and liquid conduits of said cooling module pass.

5. The modular cooling system of claim 4 wherein each of said baffle plates is mounted on at least one of the vapor and liquid cooling conduits of the associated cooling module.

6. The modular cooling system of claim 3 further comprising at least one blank baffle that closes at least one of said notches through which the vapor and liquid conduits do not pass.

7. The modular cooling system of claim 1 wherein said connections are configured to releasably connect to allow each of the cooling modules to be releasably connected to the cooling liquid supply and return manifolds.

8. The modular cooling system of claim 7 wherein said connections comprise quick disconnects.

9. The modular cooling system of claim 1 wherein the vapor and liquid conduits of each cooling module are permanently connected to the cold plate and the condenser.

10. The modular cooling system of claim 1 wherein for each cooling module, the evaporative flow path, the vapor conduit, the condensing flow path, and the liquid conduit form a looped thermosiphon for the working fluid flow through the module.

11. The modular cooling system of claim 1 wherein for each cooling module, the evaporative flow path, the vapor conduit, the condensing flow path, and the liquid conduit form a thermosiphon for the working fluid flow through the module.

12. The modular cooling system of claim 1 wherein for each cooling module, the evaporative flow path, the vapor conduit, the condensing flow path, and the liquid conduit form a heat pipe for the working fluid flow through the module.

13. The modular cooling system of claim 1 wherein for each cooling module, the evaporative flow path, the vapor conduit, the condensing flow path, and the liquid conduit form a looped heat pipe for the working fluid flow through the module.

14. The modular cooling system of claim 1 wherein at least one of said cooling modules further comprises a pump associated with said liquid conduit to enhance the working fluid flow through the cooling module; the evaporative flow path, the vapor conduit, the condensing flow path, the pump and the liquid conduit forming a pumped two-phase cooling cycle for the working fluid flow through the cooling module.

15. A cooling module for use in a modular cooling system of an electronics enclosure mounting a plurality of heat generating electronic components, the cooling system including a cooling liquid supply manifold and a cooling liquid return manifold; the cooling module comprising:

an evaporative cold plate including a cold plate inlet, a cold plate outlet, and an evaporative flow path to direct a working fluid flow from the cold plate inlet to the cold plate outlet in heat exchange relation with electronic components associated with the cold plate to reject heat from the electronic components to the working fluid flow, a condenser including a working fluid inlet, a working fluid outlet, a condensing flow path to direct the working fluid flow through the condenser from the working fluid inlet to the working fluid outlet, a cooling liquid inlet connection configured to releasably connect to the cooling liquid supply manifold to receive cooling liquid therefrom, a cooling liquid outlet connection configured to releasably connect to the cooling liquid return manifold to deliver cooling liquid thereto, and a cooling liquid flow path to direct a cooling liquid through the condenser from the cooling liquid inlet to the cooling liquid outlet in heat exchange relation with the working fluid flow in the condensing flow path to heat from the working fluid flow to the cooling liquid, a vapor conduit connecting the cold plate outlet to the working fluid inlet to direct vapor phase working fluid from the evaporative cold plate to the condenser, and a liquid conduit connecting the working fluid outlet to the cold plate inlet to direct liquid phase working fluid from the condenser to the evaporative cold plate.

16. The cooling module of claim 15 wherein each of said connections is a quick disconnect.

17. The cooling module of claim 15 wherein the vapor conduit is permanently connected to the cold plate outlet and to the working fluid inlet, and the liquid conduit is permanently connected to the liquid phase working fluid outlet and the cold plate inlet.

18. The cooling module of claim 15 wherein the evaporative flow path, the vapor conduit, the condensing flow path, and the liquid conduit form a looped thermosiphon for the working fluid flow through the module.

19. The cooling module of claim 15 wherein the evaporative flow path, the vapor conduit, the condensing flow path, and the liquid conduit form a thermosiphon for the working fluid flow through the module.

20. The cooling module of claim 15 wherein the evaporative flow path, the vapor conduit, the condensing flow path, and the liquid conduit form a heat pipe for the working fluid flow through the module.

21. The cooling module of claim 15 wherein the evaporative flow path, the vapor conduit, the condensing flow path, and the liquid conduit form a looped heat pipe for the working fluid flow through the module.

22. The cooling module of claim 15 further comprising a pump associated with said liquid conduit to enhance the working fluid flow through the cooling module; the evaporative flow path, the vapor conduit, the condensing flow path, the pump and the liquid conduit forming a pumped two-phase cooling cycle for the working fluid flow through the cooling module.

23. A modular cooling system for an electronics enclosure mounting a plurality of heat generating electronic components; the cooling system comprising:
- a plurality of cooling modules selectively mountable into the electronics enclosure, each of the cooling modules comprising
  - an evaporative cold plate including an evaporative flow path to direct a working fluid through the cold plate in heat exchange relation with electronic components associated with the cold plate to reject heat from the electronic components to the working fluid,
  - a condenser including a condensing flow path to direct the working fluid through the condenser in heat exchange relation with a cooling fluid to reject heat from the working fluid to the cooling fluid,
  - a vapor conduit connecting the evaporative cold plate to the condenser to direct vapor phase working fluid from the evaporative flow path to the condensing flow path, and
  - a liquid conduit connecting the condenser to the evaporative cold plate to direct liquid phase working fluid from the condensing flow path to the evaporative flow path,
- a cooling fluid supply manifold to direct the cooling fluid to each of the condensers;
- a cooling fluid return manifold to direct the cooling fluid from each of the condensers; and
- a wall positioned in the electronics enclosure to separate the electronic components and evaporative cold plates from the cooling fluid supply and return manifolds and the condensers of each of said cooling modules to shield the electronic components from the cooling fluid should the cooling fluid leak from the system, the wall including a plurality of notches through which the vapor and liquid conduits may pass, each of said notches is formed in a side of said wall to allow the vapor and fluid conduits of one of said cooling modules to be inserted into the electronics enclosure without disconnecting the vapor and liquid conduits from the condenser and evaporative cold plate of said one of said cooling modules.

24. The modular cooling system of claim 23 wherein each of said cooling modules further comprises a baffle plate mounted on the cooling module to close one of said notches through which the vapor and liquid conduits of said cooling module pass.

25. The modular cooling system of claim 24 wherein each of said baffle plates is mounted on at least one of the vapor and liquid cooling conduits of the associated cooling module.

26. The modular cooling system of claim 23 further comprising at least one blank baffle that closes at least one of said notches through which the vapor and liquid conduits do not pass.

27. The modular cooling system of claim 23 wherein for each cooling module, the evaporative flow path, the vapor conduit, the condensing flow path, and the liquid conduit form a looped thermosiphon for the working fluid flow through the module.

28. The modular cooling system of claim 23 wherein for each cooling module, the evaporative flow path, the vapor conduit, the condensing flow path, and the liquid conduit form a thermosiphon for the working fluid flow through the module.

29. The modular cooling system of claim 23 wherein for each cooling module, the evaporative flow path, the vapor conduit, the condensing flow path, and the liquid conduit form a heat pipe for the working fluid flow through the module.

30. The modular cooling system of claim 23 wherein for each cooling module, the evaporative flow path, the vapor conduit, the condensing flow path, and the liquid conduit form a looped heat pipe for the working fluid flow through the module.

31. The modular cooling system of claim 23 wherein at least one of said cooling modules further comprises a pump associated with said liquid conduit to enhance the working fluid flow through the cooling module; the evaporative flow path, the vapor conduit, the condensing flow path, the pump and the liquid conduit forming a pumped two-phase cooling cycle for the working fluid flow through the cooling module.

32. The modular cooling system of claim 23 wherein:
- each of said condenser's further comprises a cooling fluid inlet connection, a cooling fluid outlet connection, and a cooling fluid flow path to direct the cooling fluid through the condenser from the cooling fluid inlet to the cooling fluid outlet in heat exchange relation with the working fluid flow in the condensing flow path to reject heat from the working fluid to the cooling fluid;
- the cooling fluid supply manifold comprises a plurality of cooling fluid supply connections, each of the supply connections configured to connect with the cooling fluid inlet connection of one of said cooling modules to supply the cooling fluid thereto; and
- the cooling fluid return manifold comprises a plurality of cooling fluid return connections, each of the return connections configured to connect with the cooling fluid outlet connection of one of said cooling modules to receive the cooling fluid therefrom.

33. The modular cooling system of claim 23 further comprising a plurality of heat exchangers extending between the cooling fluid supply manifold and the cooling fluid return manifold, each of the heat exchangers including a cooling fluid flow path to direct the cooling fluid from the cooling fluid supply manifold to the cooling fluid return manifold; and wherein
- each of the condensers is engagable with one of the heat exchangers to place the working fluid flow in the condensing flow path of the condenser in heat exchange relation with the cooling fluid in the cooling fluid flow path to reject heat from the working fluid to the cooling fluid.

34. A modular cooling system for an electronics enclosure mounting a plurality of heat generating electronic components; the cooling system comprising:
- a plurality of cooling modules selectively mountable into the electronics enclosure, each of the cooling modules comprising
  - an evaporative cold plate including an evaporative flow path to direct a working fluid through the cold plate in heat exchange relation with electronic components associated with the cold plate to reject heat from the electronic components to the working fluid,
  - a condenser including a condensing flow path to direct the working fluid flow through the condenser in heat exchange relation with a cooling liquid to reject heat from the working fluid to the cooling liquid, a vapor conduit connecting the evaporative cold plate to the condenser to direct vapor phase working fluid from the evaporative flow path to the condensing flow path, and a liquid conduit connecting the condenser to the evaporative cold plate to direct liquid phase working fluid from the condensing flow path to the evaporative flow path, a cooling liquid supply manifold to direct the cooling liquid to each of the condensers;

a cooling liquid return manifold to direct the cooling liquid from each of the condensers; and a wall positioned in the electronics enclosure to separate the electronic components and evaporative cold plates from the cooling liquid supply and return manifolds and the condensers of each of said cooling modules to shield the electronic components from the cooling liquid should the cooling liquid leak from the system.

35. The cooling system of claim 34 wherein the wall comprises a plurality of notches through which the vapor and liquid conduits may pass, each of said notches is formed in a side of said wall to allow the vapor and fluid conduits of one of said cooling modules to be inserted into the electronics enclosure without disconnecting the vapor and liquid conduits from the condenser and the cold plate of said one of said cooling modules.

36. The modular cooling system of claim 35 wherein each of said cooling modules further comprises a baffle plate mounted on the cooling module to close one of said notches through which the vapor and liquid conduits of said cooling module pass.

37. The modular cooling system of claim 36 wherein each of said baffle plates is mounted on at least one of the vapor and liquid cooling conduits of the associated cooling module.

38. The modular cooling system of claim 35 further comprising at least one blank baffle that closes at least one of said notches through which the vapor and liquid conduits do not pass.

39. The modular cooling system of claim 34 wherein for each cooling module, the evaporative flow path, the vapor conduit, the condensing flow path, and the liquid conduit form a looped thermosiphon for the working fluid flow through the module.

40. The modular cooling system of claim 34 wherein for each cooling module, the evaporative flow path, the vapor conduit, the condensing flow path, and the liquid conduit form a thermosiphon for the working fluid flow through the module.

41. The modular cooling system of claim 34 wherein for each cooling module, the evaporative flow path, the vapor conduit, the condensing flow path, and the liquid conduit form a heat pipe for the working fluid flow through the module.

42. The modular cooling system of claim 34 wherein for each cooling module, the evaporative flow path, the vapor conduit, the condensing flow path, and the liquid conduit form a looped heat pipe for the working fluid flow through the module.

43. The modular cooling system of claim 34 wherein at least one of said cooling modules further comprises a pump associated with said liquid conduit to enhance the working fluid flow through the cooling module; the evaporative flow path, the vapor conduit, the condensing flow path, the pump and the liquid conduit forming a pumped two-phase cooling cycle for the working fluid flow through the cooling module.

44. The modular cooling system of claim 34 wherein:

each of said condenser's further comprises a cooling liquid inlet connection, a cooling liquid outlet connection, and a cooling liquid flow path to direct the cooling liquid through the condenser from the cooling liquid inlet to the cooling liquid outlet in heat exchange relation with the working fluid flow in the condensing flow path to reject heat from the working fluid to the cooling liquid;

the cooling liquid supply manifold comprises a plurality of cooling liquid supply connections, each of the supply connections configured to connect with the cooling liquid inlet connection of one of said cooling modules to supply the cooling liquid thereto; and the cooling liquid return manifold comprises a plurality of cooling liquid return connections, each of the return connections configured to connect with the cooling liquid outlet connection of one of said cooling modules to receive the cooling liquid therefrom.

45. The modular cooling system of claim 34 further comprising a plurality of heat exchangers extending between the cooling liquid supply manifold and the cooling liquid return manifold, each of the heat exchangers including a cooling liquid flow path to direct the cooling liquid from the cooling liquid supply manifold to the cooling liquid return manifold; and wherein each of the condensers is engagable with one of the heat exchangers to place the working fluid flow in the condensing flow path of the condenser in heat exchange relation with the cooling liquid in the cooling liquid flow path to reject heat from the working fluid to the cooling liquid.

* * * * *